(12) United States Patent
Liang

(10) Patent No.: US 7,773,383 B2
(45) Date of Patent: Aug. 10, 2010

(54) HEATSINK ASSEMBLY

(75) Inventor: Robert Liang, Taoyuan (TW)

(73) Assignee: Malico Inc., Taoyuan Hsien (TW)

( * ) Notice: Subject to any disclaimer, the term of this patent is extended or adjusted under 35 U.S.C. 154(b) by 0 days.

(21) Appl. No.: 12/348,912

(22) Filed: Jan. 6, 2009

(65) Prior Publication Data

US 2010/0172105 A1 Jul. 8, 2010

(51) Int. Cl.
H05K 7/20 (2006.01)
H01L 23/34 (2006.01)

(52) U.S. Cl. ............... 361/719; 257/719; 361/704; 361/710

(58) Field of Classification Search ............... 257/719; 361/710, 719
See application file for complete search history.

(56) References Cited

U.S. PATENT DOCUMENTS 6,093,961 A * 7/2000 McCullough ............... 257/718
6,153,932 A * 11/2000 Liang ......................... 257/712
6,476,484 B1 * 11/2002 Liang ......................... 257/718
6,644,396 B2 * 11/2003 Liang ......................... 165/185
6,728,103 B1 * 4/2004 Smedberg ................... 361/703
7,307,842 B1 * 12/2007 Liang et al. ................. 361/710
7,518,873 B2 * 4/2009 Park et al. ................... 361/710
7,564,687 B2 * 7/2009 Liu et al. .................... 361/704
7,619,892 B2 * 11/2009 Liang ......................... 361/707
2008/0232068 A1 * 9/2008 Liu et al. .................... 361/719

* cited by examiner

Primary Examiner—Gregory D Thompson

(57) ABSTRACT

A heatsink assembly includes a heatsink having a base board which includes fins extending from a top thereof and a recessed area defined in an underside thereof. The recessed area of the heatsink is adapted for engagement with a chip set. A positioning device includes a rectangular frame that is mounted to the heatsink and includes two side plates extending downward from two opposite sides thereof. Each side plate has a hook extending from an inside thereof so as to hook the chip set. Two flexible rods extend from the two opposite sides of the rectangular frame and each flexible rod has a pressing portion which presses on the top of the base board of the heatsink.

4 Claims, 7 Drawing Sheets

HEATSINK ASSEMBLY

BACKGROUND OF THE INVENTION

1. Field of the Invention

The present invention relates generally to a heatsink assembly, and more particularly, to a positioning device for connecting a heatsink to a chip set for compact electronic appliances.

2. The Prior Arts

A chip set such as BGA, QFP and CPU used on a computer generates a lot of heat which should be removed from the chip set to keep the optimal operation of the chip set. A conventional heatsink is connected to the chip set and designed to remove the heat from the chip set quickly so as to maintain the chip set to work normally.

Most of the conventional heatsinks for removing the heat from a chip set working at a high speed operation include fins and a fan, the fins absorb the heat and the fan dissipates the heat from the fins.

One of the conventional ways for connecting the heatsink to the chip set is to clip the heatsink to the socket of the chip set by metal clips. However, the conventional metal clips include a complicated structure and require a longer assembly time. The clip tends to reach its fatigue limit quickly. Besides, the chip set can be damaged during processes of installing the clips and the clips might be disengaged from the socket during transportation. Furthermore, if the chip set is directly soldered to the circuit board, there will be no place for the clip to position the heatsink.

Generally, there is a gap about 0.25 mm between the chip set and the circuit board and which is so narrow that no one thinks about using the gap for the heatsink. Some assemblers use heat dissipation tapes to connect the heatsink with the circuit board or directly connect the heatsink to the circuit board by screws. The tapes are easily dried and removed from the surface of the chip set and the screws require holes drilled in the circuit board. There is a limited area on the circuit board so that the holes cannot be drilled in the desired positions. Therefore, most of the manufacturers for making the circuit boards do not drill holes in the circuit boards.

Some manufacturers develop a positioning device that includes a through hole at the center and four side plates extending from four sides of the device. Each side plate includes a hook on an inside thereof. When the heatsink extends through the through hole from the underside of the device, the hooks are hooked to two sides of the chip set, and the heatsink is securely positioned on the chip set.

However, due to manufacturing problems, the hooks might not hook to the sides of the chip set and the heatsink may not have straight or smooth bottom for the heatsink to contact the chip set properly. Therefore, the heat from the chip set cannot be transferred to the heatsink as desired. There are only two side plates hook to two sides of the chip set and the other two side plates are engaged with two slots defined in the heatsink so as to well position the device to the heatsink. The four side plates of the positioning device have the same height so the heatsink has to remove material to form the two grooves through which the side plates of the side plates pass. However, the slots reduce the area for removing the heat from the chip set.

Yet another conventional positioning device for the heatsink includes a rectangular frame and two side plates extend from two opposite sides of the frame, and each side plate has two hooks on an inside thereof. Two positioning rods extend from the other two opposite sides of the frame. A plurality of flexible rods extend from the insides of the frame and each flexible rod has a protrusion on a bottom of a distal end thereof. A plurality of fins of the heatsink extend through the through hole in the center of the frame and hook on the two side plates hook two sides of the chip set. The positioning rods insert through holes defined through the heatsink, and the protrusions on the flexible rods are rested on the heatsink.

Another conventional positioning device includes two hooks on two sides to position the heatsink, and there are two stops on the other sides of the positioning device to prevent the relative movement of the positioning device and the chip set. Nevertheless, the latest electronic products are made to be even more compact and the printed circuit board is made to be smaller than before, while more parts are installed to the small printed circuit board. According to the regulation of JEDC, a 3 mm gap is required between the chip sets so as to avoid interference and over heat. In order to meet the requirement, more and more parts are installed to close to the BGA, which causes the stops mentioned above to push the rectangular frame upward so that the heatsink cannot be in contact with the chip set, and the heatsink is slidable relative to the positioning device.

The present invention provides a positioning device for positioning a heatsink to the chip set and the positioning device is designed to improve the shortcoming of the above mentioned positioning device which pushes the frame upward and causes the heatsink to not be in contact with the chip set, and the heatsink is slidable relative to the positioning device.

SUMMARY OF THE INVENTION

A primary objective of the present invention is to provide a heatsink assembly wherein a recessed area is defined in an underside of the heatsink so as to receive the chip set therein. The present invention does not need the stops as mentioned in the conventional way.

According to the present invention, a heatsink assembly is provided and comprises a heatsink including a base board and a recessed area defined in an underside of the base board so that a chip set is engaged with the recessed area. A positioning device has a rectangular frame which has a through hole defined in a center thereof and two side plates extend downward from two opposite sides of the rectangular frame, respectively. Each side plate has one hook so as to support the chip set. Two flexible rods extend from the two opposite sides of the rectangular frame and each flexible rod has a pressing portion extending perpendicularly downward from a distal end thereof. The rectangular frame is mounted to the heatsink and the pressing portions press on a top of the base board of the heatsink.

Another characteristic of the present invention is to provide fins extending from the top of the base board of the heatsink and the recessed area extends in parallel with the fins and passes through two sides of the underside of the base board. There will be no interference when mounting the rectangular frame to the heatsink.

A further characteristic of the present invention is to provide two positioning walls extending downward from two sides of the base board of the heatsink. The two positioning walls engage with two sides of the chip set. The positioning device as mentioned above is used to clamp the heatsink and the chip set together.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

With reference to the drawings and in particular to FIGS. 1 to 4, a heatsink assembly in accordance with a first embodiment of the present invention comprises a heatsink 1 and a positioning device 2. The positioning device 2 clamps the heatsink 1 and a chip set 3 together, wherein the chip set 3 is connected to a BGA socket on a circuit board 31, or soldered to the circuit board directly.

Figure 1:
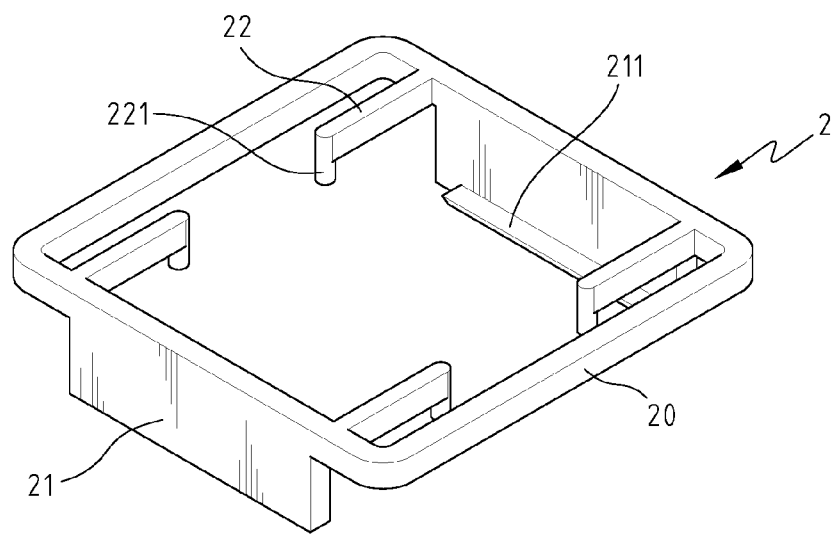
FIG. 1 is an exploded perspective view showing a heatsink assembly in accordance with a first embodiment of the present invention.
Figure 1:
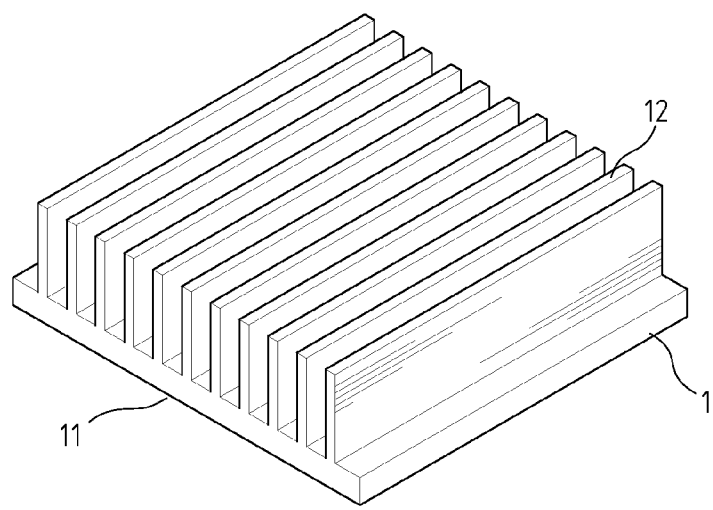
Figure 1:
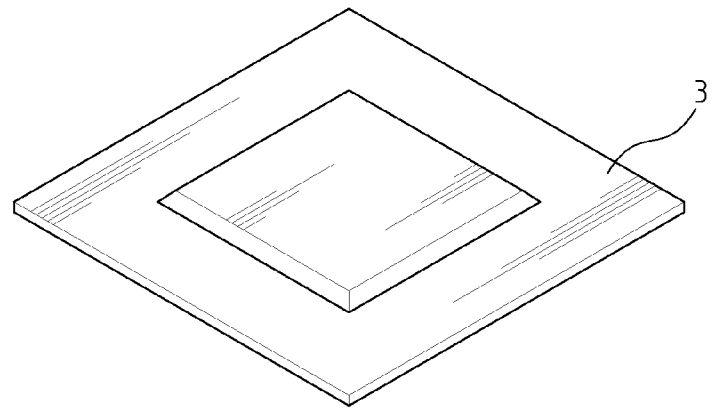

The heatsink 1 is an aluminum heatsink 1 and made by way of extruding. The heatsink 1 includes a base board with multiple fins 12 extending from a top thereof and a recessed area 11 is defined in an underside of the base board. The type of the fins is not limited to that as shown in FIG. 1. The recessed area 11 is designed and shaped to accommodate a chip 32 on the chip set 3. The recessed area 11 may extend in parallel with the fins 12 and pass through two sides of the underside of the base board of the heatsink 1.

The positioning device 2 has a rectangular frame 20 which has a through hole defined in a center thereof. Two side plates 21 extend from two opposite sides of the rectangular frame 20 and each side plate 21 has one hook 211 extending from an inside thereof. Two flexible rods 22 extend from the two opposite sides of the rectangular frame 20 and each flexible rod 22 has a pressing portion 221 extending perpendicularly downward from a distal end thereof.

Figure 2:
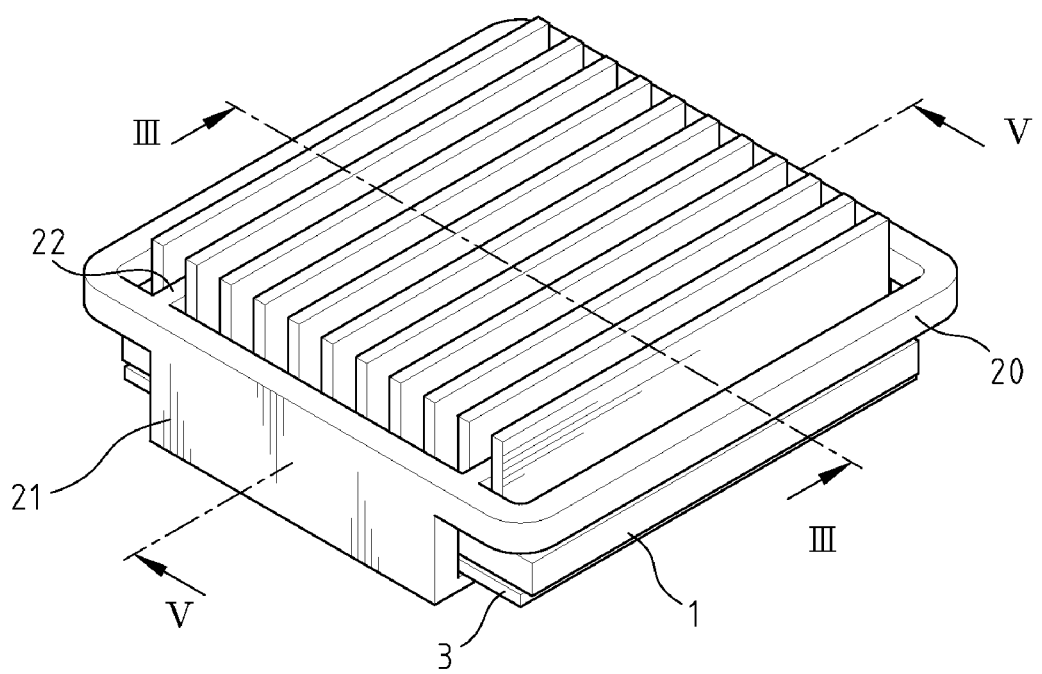
FIG. 2 is a perspective view showing the heatsink assembly in accordance with the first embodiment of the present invention.
Figure 3:
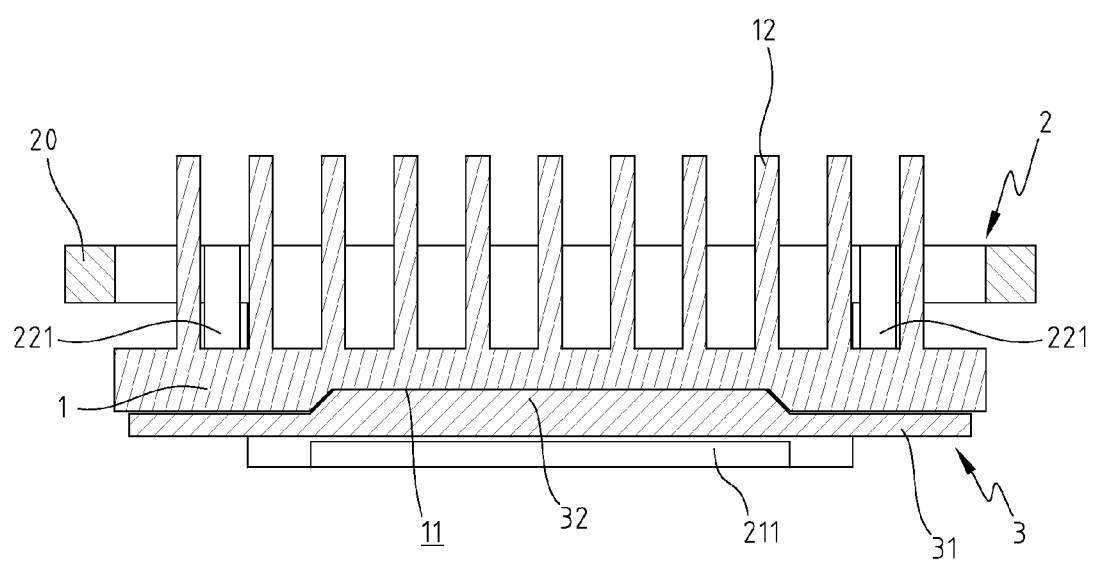
FIG. 3 is a cross sectional view taken along line III-III in FIG. 2.
Figure 4:
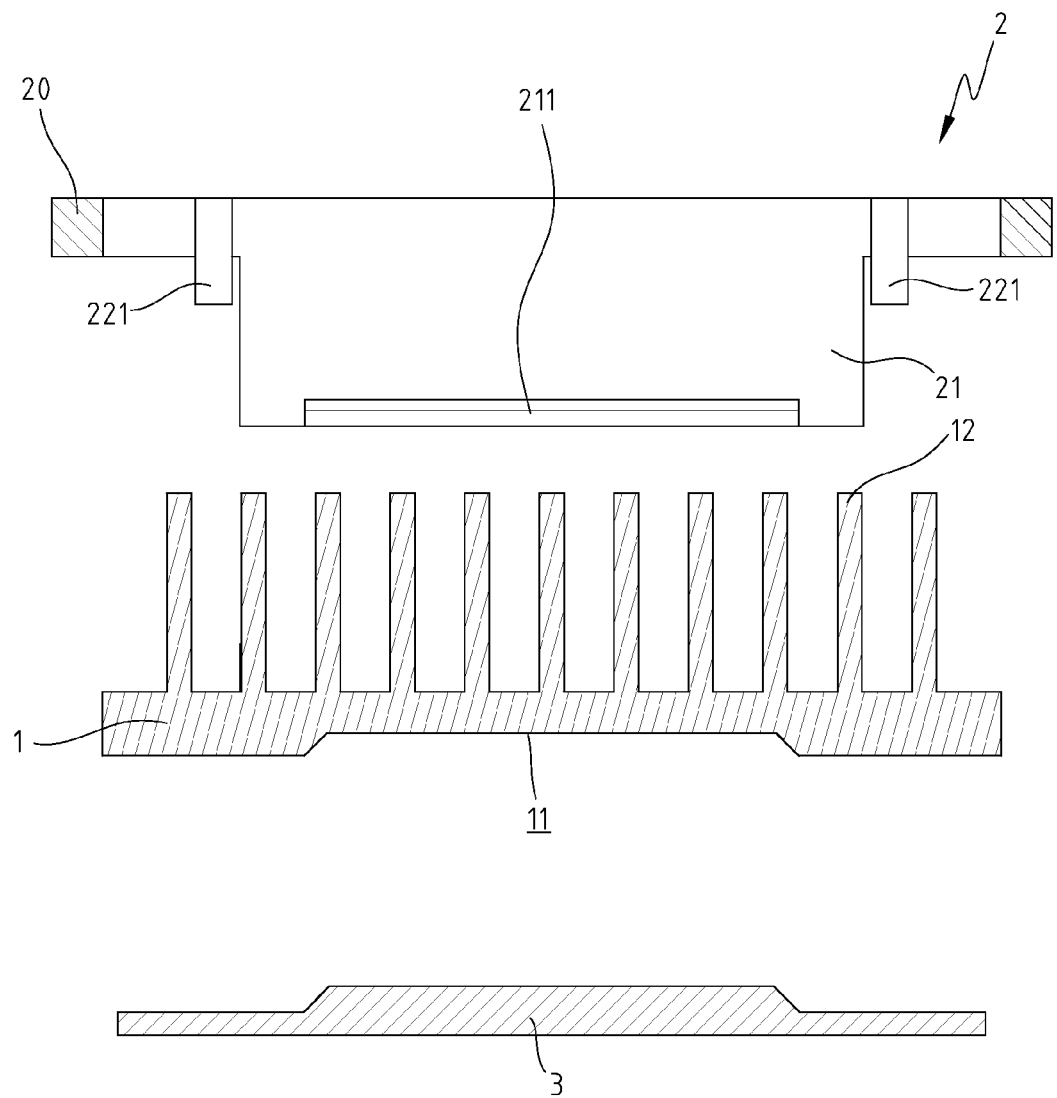
FIG. 4 is an exploded view to show the cross sectional view of each part of the heatsink assembly in accordance with the first embodiment of the present invention.
Figure 5:
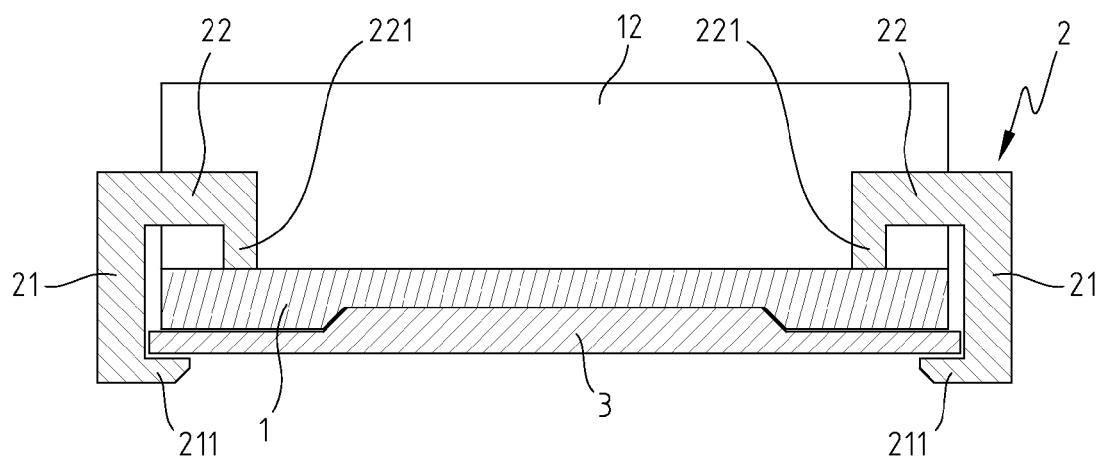
FIG. 5 is a cross sectional view taken along line V-V in FIG. 2.

As shown in FIGS. 2, 3 and 5, the heatsink 1 is directly mounted to the chip set 3 which is engaged with the recessed area 11. The recessed area 11 passes through the two sides of the underside of the base board of the heatsink 1 so that the chip set 3 can be adjusted slightly when needed. The rectangular frame 20 is mounted to the heatsink 1 and the hooks 221 on the two side plates 21 hook the two edges of the circuit board 31. The four sides of the circuit board 31 are stopped by the side plates 21 and the other two sides of the recessed area 11 so that the chip set 3 does not shift within the recessed area 11. The flexible rods 22 are engaged between the fins 12 and the pressing portions 221 press on the top of the base board of the heatsink 1 to keep close contact between the heatsink 1 and the chip set 3.

Figure 6:
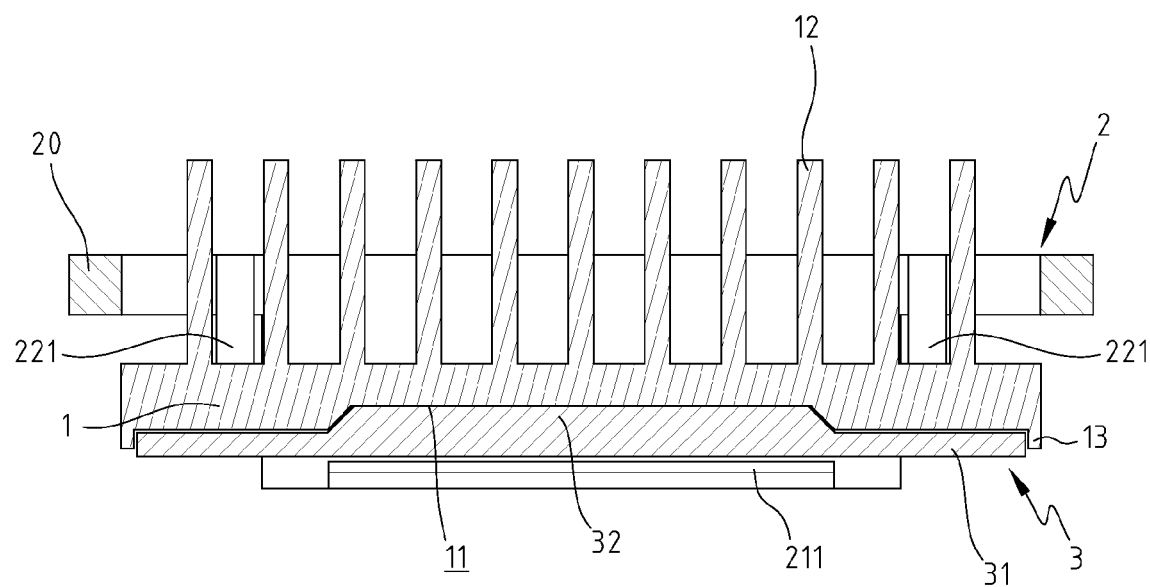
FIG. 6 is a cross sectional view showing a heatsink assembly in accordance with a second embodiment of the present invention.

FIG. 6 shows a heatsink assembly in accordance with a second embodiment of the present invention, wherein the heatsink 1 has the same structure as that in the first embodiment except that the heatsink 1 of the second embodiment further includes two positioning walls 13 extending downward from the other two sides of the base board of the heatsink 1 and a distance between the two positioning walls 13 is substantially equal to a width of the circuit board 31, so that the circuit board 31 can be positioned between the two positioning walls 13.

Figure 7:
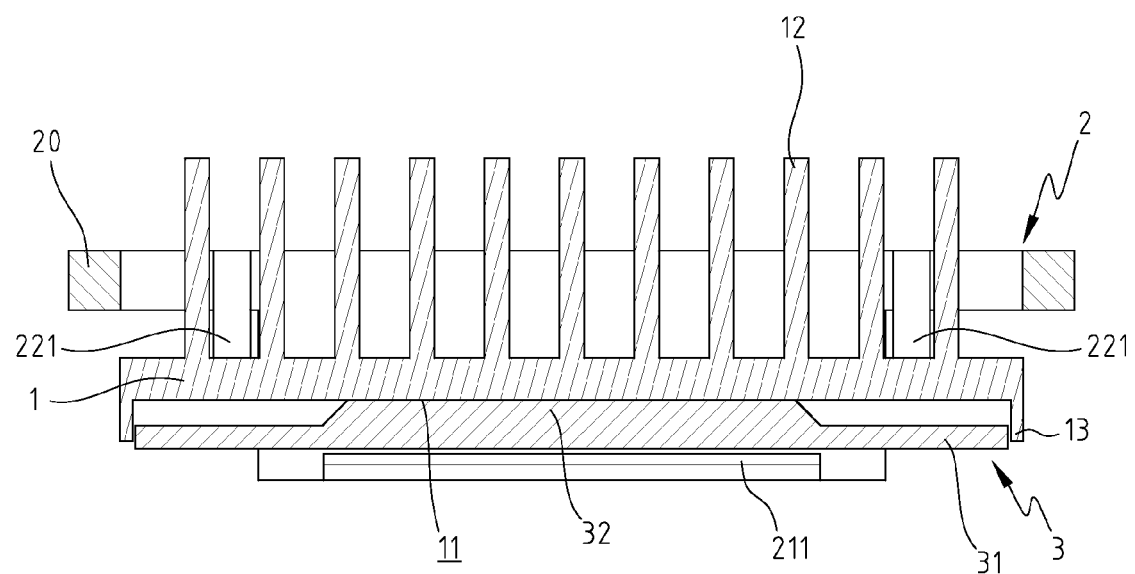
FIG. 7 is a cross sectional view showing a heatsink assembly in accordance with a third embodiment of the present invention.

FIG. 7 shows a heatsink assembly in accordance with a third embodiment of the present invention, wherein no recessed area is defined in the underside of the base board of the heatsink 1. In stead, the heatsink 1 includes two positioning walls 13 extending downward from two sides of the base board of the heatsink 1 and a distance between the two positioning walls 13 is substantially equal to a width of the circuit board 31, so that the circuit board 31 can be positioned between the two positioning walls 13. The positioning device 2 has the same structure as that in the first embodiment and clamps the heatsink 1 and the chip set 3 together.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A heatsink assembly, comprising:
   a heatsink including a base board and a recessed area defined in an underside of the base board, the recessed area of the heatsink being adapted for engagement with a chip set; and
   a positioning device having a rectangular frame which has two opposite sides and a through hole defined in a center thereof, each of the two opposite sides having a side plate extending downward and two flexible rods extending inward, each side plate having a hook extending from an inside thereof so as to hook the chip set, and each flexible rod having a pressing portion extending perpendicularly downward from a distal end thereof, the rectangular frame mounted to the heatsink and the pressing portions pressing on a top of the board of the heatsink.

2. The heatsink assembly as claimed in claim 1, wherein the heatsink includes multiple fins extending from a top side of the base board, the flexible rods are engaged between the fins, the recessed area extends in parallel with the fins and passes through two sides of the underside of the base board.

3. The heatsink assembly as claimed in claim 1, wherein the heatsink further includes two positioning walls, respectively, each of the two positioning walls extending downward from one of two opposite sides of the base board for engagement with one of two opposite sides of the chip set.

4. A heatsink assembly, comprising:
   a heatsink including a base board, and two positioning walls, each of the two positioning walls extending downward from one of two opposite sides of the base board and being adapted for engagement with one of two opposite sides of a chip set; and
   a positioning device having a rectangular frame which has two opposite sides and a through hole defined in a center thereof, each of the two opposite sides having a side plate extending downward and two flexible rods extending inward, each side plate having a hook extending from an inside thereof so as to hook the chip set, and each flexible rod having a pressing portion extending perpendicularly downward from a distal end thereof, the rectangular frame mounted to the heatsink and the pressing portions pressing on a top of the board of the heatsink.

* * * * *